United States Patent [19]

Duttweiler et al.

[11] Patent Number: 4,591,669
[45] Date of Patent: May 27, 1986

[54] ADAPTIVE FILTER UPDATE GAIN NORMALIZATION

[75] Inventors: Donald L. Duttweiler, Rumson; John Hartung, Marlboro, both of N.J.

[73] Assignee: AT&T Bell Laboratories, Murray Hill, N.J.

[21] Appl. No.: 654,410

[22] Filed: Sep. 26, 1984

[51] Int. Cl.⁴ .................. H04B 3/20; H03H 15/00
[52] U.S. Cl. .................. 179/170.2; 333/166; 364/724
[58] Field of Search .......... 179/170.2, 170.6, 170.8; 333/28 R, 166, 17 R, 17 L; 364/724

[56] References Cited

U.S. PATENT DOCUMENTS

| | | | |
|---|---|---|---|
| 3,821,493 | 6/1974 | Chiba | 179/170.2 |
| 3,922,505 | 11/1975 | Hoge | 179/170.2 |
| 4,467,441 | 8/1984 | Gritton | 364/724 |
| 4,468,640 | 8/1984 | Gritton | 333/166 |
| 4,468,641 | 8/1984 | Duttweiler et al. | 333/166 |

OTHER PUBLICATIONS

D. L. Duttweiler, "A Twelve-Channel Digital Echo Canceler", *IEEE Transactions on Communications*, vol. COM-26, No. 5, May 1978.

*Primary Examiner*—Gene Z. Rubinson
*Assistant Examiner*—R. Vaas
*Attorney, Agent, or Firm*—Thomas Stafford

[57] ABSTRACT

Update gain normalization is employed in adaptive filters to control weighting of the filter impulse response updates in order to converge properly to a desired impulse response. Singing, i.e., oscillating, of the filter is overcome by adjusting the update gain when an incoming signal power estimate used to normalize the gain exceeds a prescribed threshold value. In one example, the normalized gain is adjusted to be a fixed value for power estimate values which exceed the threshold. In accordance with another aspect of the invention, a single normalized gain value is used to adjust the update gain in two adaptive filters employed as echo cancelers in a bidirectional voice frequency repeater.

17 Claims, 9 Drawing Figures

ADAPTIVE FILTER UPDATE GAIN NORMALIZATION

TECHNICAL FIELD

This invention relates to adaptive filters and, more particularly, to normalization of the filter update gain.

BACKGROUND OF THE INVENTION

Adaptive filters operate on a signal supplied thereto in accordance with a prescribed criterion to generate a desired output signal. Typically, the filters generate an impulse response characteristic in accordance with an algorithm which includes updating of the impulse response characteristic in response to an error signal. In this way the filter characteristic is optimized to yield the desired result.

It has been found advantageous to normalize the update gain of the adaptive filter. The normalization tends to make the performance of the filter insensitive to variations in received signal power. In one prior arrangement an average of the squares of input signal sample magnitudes is used to normalize the gain, as described in an article by Mr. D. L. Duttweiler entitled "A Twelve-Channel Digital Echo Canceler", *IEEE Transactions on Communications*, Vol. COM-26, No. 5, May 1978, pp. 647-653. Another gain normalization arrangement employing a sum of the squares power estimate is disclosed in U.S. Pat. No. 3,922,505 issued Nov. 25, 1975. These prior arrangements attempt to protect against generating noisy, i.e., uncontrollably large, tap weights by controlling the update gain to be a "low" value for large incoming signal power estimate values.

Although these prior arrangements may perform satisfactorily in some applications, problems arise in others. For example, situations can arise where the open-loop gain of the circuit including the adaptive filter becomes greater than unity. This causes "singing", i.e., oscillating, to occur in the circuit which, in turn, causes large power estimate values. In such instances, the low gain value generated by the prior gain normalization arrangements would slow down the correction of the oscillating condition.

Another problem may arise in applications where two adaptive filters are employed as echo cancelers in a bidirectional voice frequency repeater when talking in both directions of transmission occurs simultaneously. This occurs, for example, for full duplex data set transmission. When talking occurs in both directions of transmission, the echo cancelers are typically inhibited from updating their impulse response characteristics and proper estimates of the echo signals are not obtained.

SUMMARY OF THE INVENTION

The problems of prior adaptive filter update gain normalization arrangements resulting in singing, i.e., oscillating, and other undesirable results are overcome, in accordance with an aspect of the invention, by controllably adjusting the update gain when a normalization factor, e.g., power estimate of an incoming signal, used to normalize the gain exceeds a prescribed threshold.

In one example, not to be construed as limiting the scope of the invention, the normalized gain is controlled to be a fixed value for power estimates which exceed the prescribed threshold.

In another example, the normalized gain value is adjusted to be a value greater than that which would normally be generated for power estimate values which exceed the prescribed threshold value.

In accordance with another aspect of the invention, a single normalized gain value is used for updating the gain in both the adaptive filters employed as echo cancelers in a bidirectional voice frequency repeater.

BRIEF DESCRIPTION OF THE DRAWING

The invention will be more fully understood from the following detailed description of an illustrative embodiment taken in connection with the appended figures in which.

DETAILED DESCRIPTION

Figure 1:
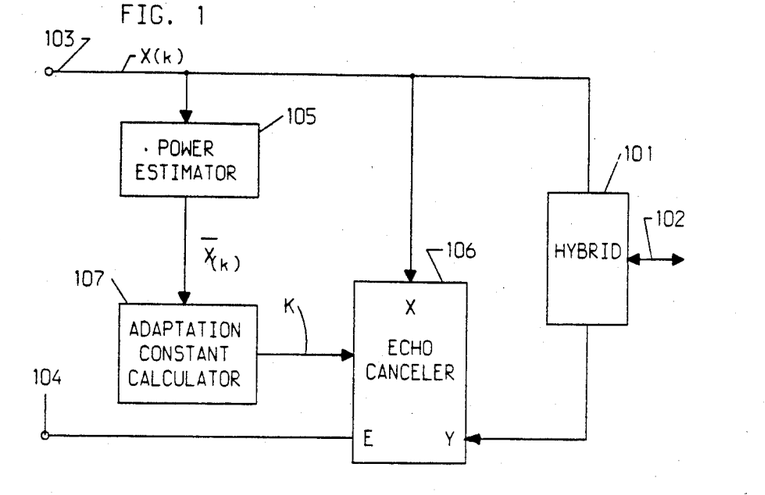
FIG. 1 shows a transmission network employing an adaptive filter as an echo canceler which includes the invention.

FIG. 1 shows in simplified block diagram form a transmission network including an aspect of the invention. The embodiment of FIG. 1 is intended to couple via hybrid 101 a bidirectional transmission path or facility 102 to a circuit arrangement including incoming unidirectional transmission path or facility 103 and outgoing unidirectional transmission path or facility 104. Such incoming and outgoing circuit arrangements are, for example, four-wire transmission facility or switching machine terminations.

Accordingly, incoming signals are supplied via unidirectional transmission path 103 to power estimator 105, an X input of echo canceler 106 and hybrid 101 and, hence, to bidirectional transmission path 102. Outgoing signals from bidirectional path 102 are supplied via hybrid 101 to the Y input of echo canceler 106. An output signal from the E output of echo canceler 106 is supplied to outgoing unidirectional transmission path 104. Power estimator 105 generates power estimate $\overline{X}(k)$ which is supplied to adaptation constant calculator 107. Adaptation constant calculator 107 generates a normalized gain value K which has a characteristic in relationship to power estimate $\overline{X}(k)$, in accordance with an aspect of the invention, so that normalized gain value K is controllably adjusted to have a prescribed value when the value of power estimate $\overline{X}(k)$ exceeds a predetermined threshold value. Normalized gain value K is supplied to echo canceler 106 where it is used to adjust the normalized update gain for all the taps therein.

Figure 5:
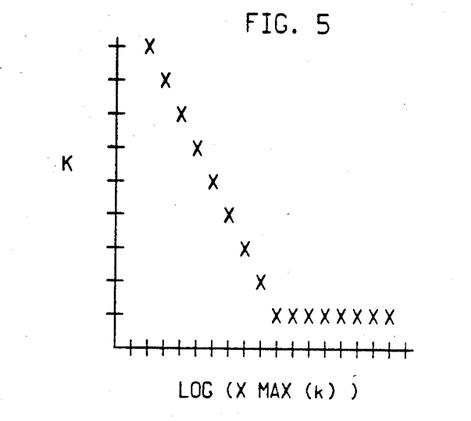
FIG. 5 is a graphical representation of a normalized gain characteristic, i.e., adaptation constant, illustrating an aspect of the invention.

It is noted that larger values of power estimate $\overline{X}(k)$ only occur when the transmission network is in a so-called "singing" condition, i.e., oscillating, and, consequently, prior gain normalization arrangements generate a normalized gain value as a first function of the power estimate x(k) that normally would cause a low value of normalized gain value K to be generated which slows down the correction of the oscillating condition. We have determined that as $\overline{X}(k)$ becomes large in value, the singing condition can be avoided or its length of time minimized by either boosting the normalized gain value to be a value greater than that which would normally be generated for the power estimate values which exceed a prescribed threshold value or setting it at a fixed value. A specific normalized gain characteristic, not to be construed as limiting the scope of the invention, is shown in FIG. 5.

Figure 2:
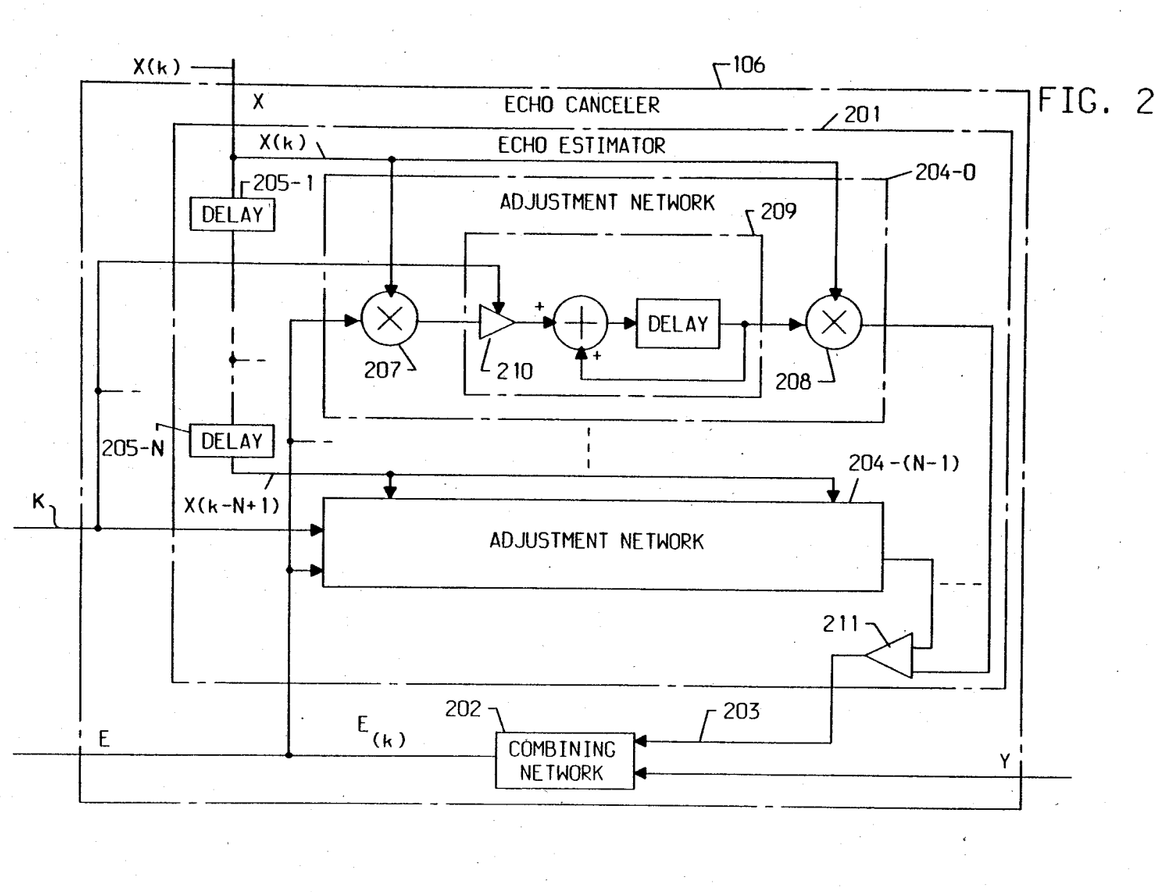
FIG. 2 depicts in simplified form details of the echo canceler employed in transmission networks of FIG. 1 and FIG. 6.

FIG. 2 shows in simplified block diagram form detail of an adaptive filter which is advantageously employed for echo canceler 106. Echo canceler 106 is broadly similar to echo cancelers disclosed in U.S. Pat. Nos. 3,499,999 and 3,500,000. Also see an article entitled "A Single-Chip VLSI Echo Canceler", by D. L. Duttweiler and Y. S. Chen, *The Bell System Technical Journal*, Vol. 59, No. 2, February 1980, pages 149-159, and an article entitled "Bell's Echo-Killer Chip", *IEEE Spectrum*, October 1980, pages 34-37. In this embodiment echo canceler 106 also includes an arrangement for controllably adjusting the normalized update gain of each tap in the adaptive filter employed in the echo canceler.

Briefly, canceler 106 includes an adjustable signal processor, i.e., adaptive filter having a closed loop error control system which is self-adapting in that it automatically tracks signal variation in an outgoing path. More specifically, canceler 106 employs echo estimator 201 including an adaptive transversal filter arrangement for synthesizing a linear approximation of the echo, i.e., an echo estimate.

To this end, far end incoming signal X(k) is usually supplied from a far end talking party over a first transmission path, e.g., path 103 (FIG. 1), to a first input, namely input X, of echo canceler 106 and therein to an input of echo estimator 201. Far end signal X(k) may be, for example, a digitally sampled speech signal, where k is an integer identifying the sampling interval. However, because of an impedance mismatch, for example, in hybrid 101 (FIG. 1), a portion of the hybrid input signal is reflected to the far end signal source as an echo. The echo is supplied from an output of hybrid 101 to the Y input of canceler 109 and therein to a first input of combining network 202. A second input to combining network 202 is a signal estimate of the echo generated by echo estimator 201. The echo estimate is supplied via lead 203 from an output of echo estimator 201 to the second input of combining network 202. Combining network 202 generates error signal E(k) corresponding to the algebraic difference between the echo estimate and the Y input to the echo canceler including the undesirable echo. Error signal E(k) is supplied via output E to path 104 (FIG. 1) and to adjustment networks 204-0 through 204-N in estimator 201.

Estimator 201 includes a so-called tapped delay line comprised of delay units 205-1 through 205-N for realizing desired delays at the taps corresponding to convenient Nyquist intervals. Therefore, delayed replicas X(k-1) through X(k-N) of incoming far end signal X(k) are generated at the corresponding taps. The signal at each tap position, namely X(k-1) through X(k-N) as well as X(k), is adjusted in response to error signal E(k). More particularly, signals X(k) through X(k-N) are individually weighted in response to E(k) via a corresponding one of adjustment networks 204-0 through 204-N, respectively. Adjustment networks 204-0 through 204-N each include multipliers 207 and 208, and feedback circuit 209. Feedback circuit 209 adjusted the tap weight to a desired value in a manner which will be apparent to those skilled in the art and explained in the above-noted references. In this adjustment, it is important to adjust the individual loop gains K(k) via controllable amplifier 210 to result in a stable system and, in accordance with the invention, to eliminate or minimize "singing", i.e., oscillation. This is realized by adjusting the loop gain K with the value normalized in accordance with the characteristic shown in FIG. 5 and generated by the adaptation constant calculator. The weighted replicas of X(k) from adjustment networks 204-0 through 204-N are summed via summing network 211 to generate the echo estimate signal approximating the echo to be canceled. The echo estimate is supplied via lead 203 to the second input of combining network 202. In one embodiment, the number (N) of taps in echo canceler 106 is 24.

Figure 3:
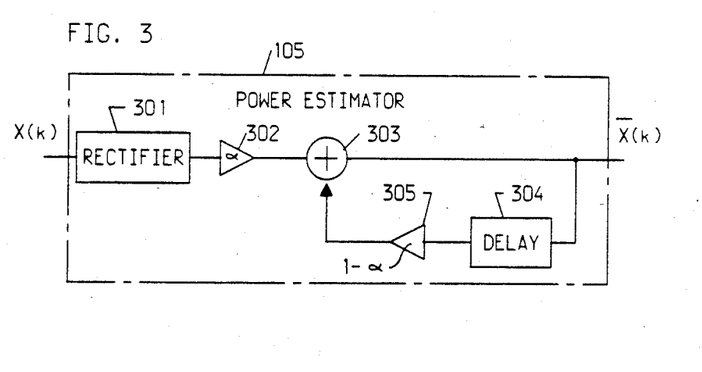
FIG. 3 shows details of the power estimator circuit eployed in the transmission networks of FIG. 1 and FIG. 6.
Figure 6:
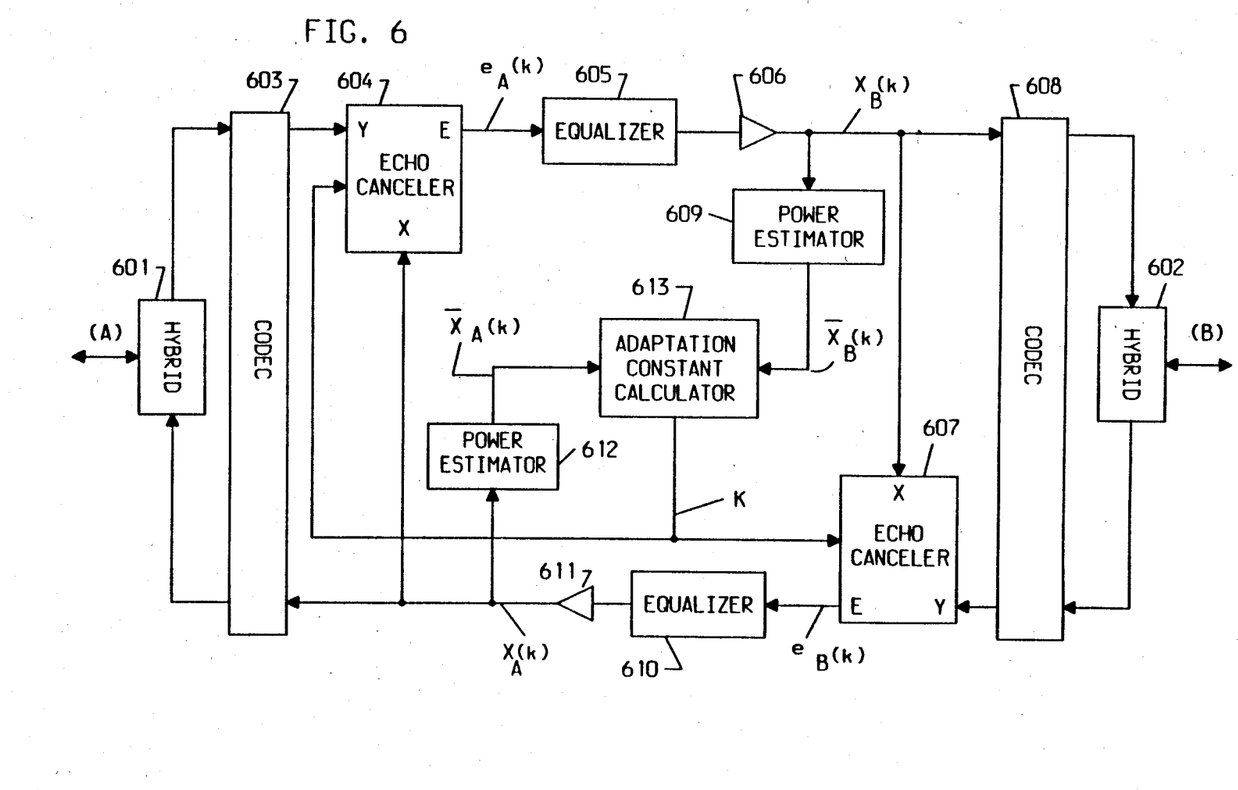
FIG. 6 shows in simplified block diagram form a bidirectional transmission network employing aspects of the invention.

FIG. 3 shows in simplified block diagram form details of power estimator 105 employed in the embodiments of FIG. 1 and FIG. 6. Power estimator 105 is essentially a low pass filter having a characteristic $$\overline{X}(k) = \alpha |X(k)| + (1-\alpha)\overline{X}(k-1). \tag{1}$$

X(k) is, for example, a digital signal of sampling interval k. Accordingly, X(k) is supplied to rectifier 301 to generate $|X(k)|$. Then, $|X(k)|$ is amplified by factor $\alpha$ in amplifier 302 and $\alpha|X(k)|$ is supplied to one input of adder 303. An output from adder 303 is $\overline{X}(k)$. $\overline{X}(k)$ is supplied via delay unit 304 and amplifier 305 to a second input of adder 303. Delay unit 304 delays $\overline{X}(k)$ by a sampling interval to yield $\overline{X}(k-1)$ and amplifier 305 amplifies $\overline{X}(k-1)$ to generate $(1-\alpha)\overline{X}(k-1)$ which is supplied to the second input of adder 303.

Figure 4:
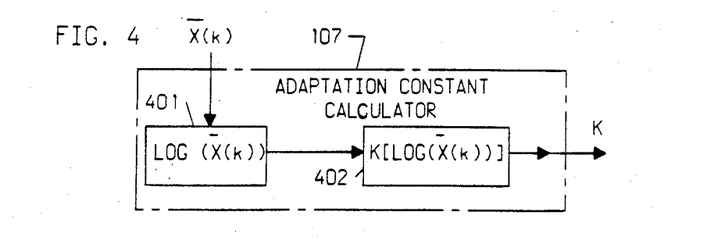
FIG. 4 depicts details of the adaptation constant calculator used in the transmission network of FIG. 1.

FIG. 4 depicts in simplified block diagram form details of adaptation constant calculator 107 employed in the embodiment of FIG. 1. Accordingly, $\overline{X}(k)$ is supplied to unit 401 which generates $LOG(\overline{X}(k))$. In turn, unit 402 generates $K[LOG(\overline{X}(k))]$ and yields K in accordance with the characteristic shown in FIG. 5. This is realizable by using a table look-up. That is to say, $K[LOG(\overline{X}(k))]$ is the address in a read only memory (ROM) for the value of K. Alternatively, the value of $\overline{X}(k)$ can be used directly to address a ROM to generate a corresponding value of K.

FIG. 5 shows a normalized gain characteristic which may be employed, in accordance with an aspect of the invention, to minimize "singing", i.e., oscillating, in the embodiments of FIGS. 1 and 6. Heretofore, as $\overline{X}(k)$ or, in this example, $LOG[\overline{X}(k)]$ increased, the normalized gain K would continue to decrease. This resulted in problems because large values of $\overline{X}(k)$ typically occur only when the circuit is singing, i.e., oscillating, and the "low" value of the normalized gain K slows down the recovery from instability and oscillating. As shown in FIG. 5, the normalized gain K for "large" values of $\overline{X}(k)$ is boosted so that it remains, in this example, at a fixed predetermined value. It is again noted that the gain boost for large values of $\overline{X}(k)$ does not affect the normal voice frequency signals because their average power levels are not at large as those resulting during singing intervals. Typical values of normalized gain K for $\overline{X}_{MAX}(k)$ in dBmo are as follows:

| $\overline{X}_{MAX}(k)$ | K |
|---|---|
| > $-\infty$ | 0 |
| > $-50.83$ | 1 |
| > $-44.54$ | .5 |
| > $-38.65$ | .25 |
| > $-35$ | .125 |
| > $-30.67$ | .0625 |
| > $-27.64$ | .03155 |
| > $-23.81$ | .015625 |
| > $-21.02$ | .0078125 |
| > $-17.4$ | .0078125 |
| > $-14.72$ | .0078125 |
| > $-11.2$ | .0078125 |
| > $-8.57$ | .0078125 |
| > $-5.09$ | .0078125 |
| > $-2.48$ | .0078125 |
| > .98 | .0078125 |
| > 3.174 | .0078125 |

FIG. 6 shows in simplified block diagram form details of an automatically adaptive bidirectional voice frequency repeater employing aspects of the invention. The repeater shown in FIG. 6 is intended to enhance voice frequency signals being transmitted on a 2-wire transmission path or facility.

Accordingly, shown in FIG. 6 are hybrid circuits 601 and 602 which are adapted for coupling signals to and from the repeater to bidirectional transmission paths A and B, respectively. Hybrids 601 and 602 may be any of the hybrid arrangements known in the art for coupling signals from a bidirectional 2-wire transmission path or facility to incoming and outgoing unidirectional transmission paths or facilities. In one example, hybrids 601 and 602 are of the electronic type.

An incoming signal output from hybrid 601 is supplied to an encoder input of CODEC 603. In this example, the encoder of CODEC 603 converts the analog input signal into an 8-bit µ-law PCM digital signal, in well-known fashion. The 8-bit µ-law PCM digital signal from CODEC 603 is supplied to a Y input of echo canceler 604. Output E from echo canceler 604 is supplied via equalizer 605 and gain unit 606 to an X input of echo canceler 607, to a decoder input of CODEC 608 and to power estimator 609. The decoder of CODEC 608 converts the 8-bit µ-law PCM output from echo canceler 604 into an analog output signal, in well-known fashion. The analog output from CODEC 608 is supplied to hybrid 602 and, in turn, to bidirectional 2-wire facility B.

An analog signal from bidirectional 2-wire facility B is supplied via hybrid 602 to an encoder input of CODEC 608. In turn, CODEC 608 converts the analog input signal, in this example, into a digital µ-law PCM signal which is supplied to the Y input of echo canceler 607. Output E from echo canceler 607 is supplied via equalizer 610 and gain unit 611 to the X input of echo canceler 604, to a decoder input of CODEC 603 and to power estimator 612. CODEC 603 converts the 8-bit µ-law output E from echo canceler 607 into an analog signal, in well-known fashion. The analog signal from CODEC 603 is supplied via hybrid 601 to bidirectional 2-wire facility A.

Echo canceler 604 is employed to cancel the echo signal or reflected signal resulting in the signal transmission from bidirectional 2-wire facility A because of the signal incoming to the repeater from bidirectional 2-wire facility B. Similarly, echo canceler 607 is employed to cancel the echo or reflected signal resulting in the signal transmission from bidirectional 2-wire facility B because of the signal incoming to the repeater from bidirectional facility A. Details of an echo canceler which may be employed for cancelers 604 and 607 are shown in FIG. 2 and have been described above.

In this example, equalizers 119 and 124 each include an eighth order finite impulse response filter of a type known in the art.

Power estimators 609 and 612 are identical to power estimator 105, details of which are shown in FIG. 3 and have been described above. Accordingly, power estimator 609 generates power estimate $\overline{X}_A(k)$ of $X_A(k)$, in accordance with equation (1), which is supplied to adaptation constant calculator 613. Similarly, power estimator 612 generates power estimate $\overline{X}_B(k)$ of $X_B(k)$, in accordance with equation (1), which is also supplied to adaptation constant calculator 613.

Adaptation constant calculator 613 generates normalized gain value K in a manner described below which is supplied to both of echo cancelers 604 and 607 to set the update gain for all the taps in each of the transversal filters used therein. In accordance with an aspect of the invention, adaptation constant calculator 613 selects between power estimate $\overline{X}_B(k)$ and $\overline{X}_A(k)$ in accordance with a prescribed criterion for generating normalized gain value K which is then used to adjust the update gain in each of echo cancelers 604 and 607. Consequently, each of echo cancelers 604 and 607 is allowed to adapt to a desired impulse response characteristic even when there is "talking" in both directions of transmission. Heretofore, talking in each direction of transmission would have caused both echo cancelers to be inhibited from being updated.

Use of the same update gain value K for both directions of transmission also helps when singing, i.e., oscillating, is occurring to stabilize the repeater. That is, if one of the power estimates $\overline{X}_A(k)$ or $\overline{X}_B(k)$ is large relative to normally expected voice band signals, an unstable system is indicated and the update gain is controllably adjusted, as described above in relationship to the embodiment of FIG. 1, for both echo cancelers 604 and 607 and the repeater is rapidly stabilized. That is to say, the normalized gain value K is either boosted or set at a fixed value for values of $\overline{X}_{MAX}(k)$ which exceed a predetermined threshold.

Figure 7:
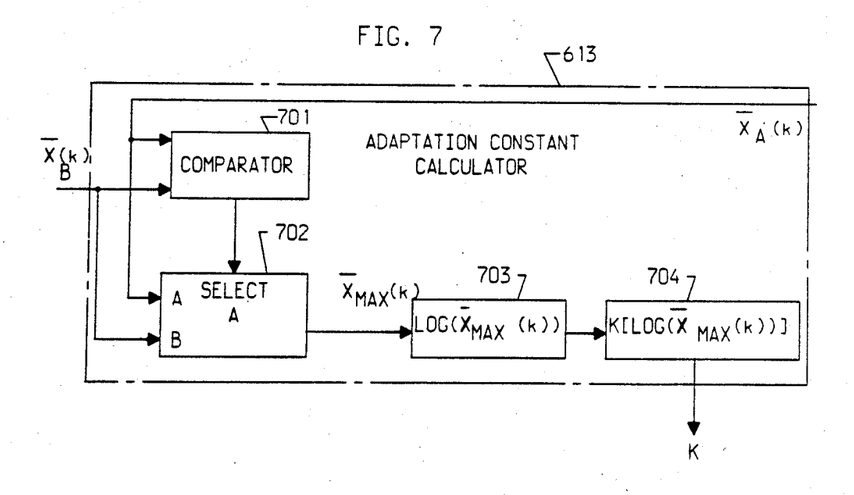
FIG. 7 depicts details of the adaptation constant calculator used in the embodiment of FIG. 6.

FIG. 7 shows in block diagram form details of adaptation constant calculator 613 used in the embodiment of FIG. 6. Accordingly, power estimate $\overline{X}_A(k)$ is supplied to one input of comparator 701 and to input A of digital selector 702 while power estimate $\overline{X}_B(k)$ is supplied to a second input of comparator 701 and to output B of selector 702. Comparator 701 generates an output representative of a logical 1 or true signal when $\overline{X}_A(k) > \overline{X}_B(k)$. This output from comparator 701 is supplied to the select input of digital selector 702. Selector 702 is operative to normally supply $\overline{X}_B(k)$ to its output except when $\overline{X}_A(k)$ is selected in response to the true signal from comparator 701. Simply stated, the output from selector 702 is the maximum of $\overline{X}_A(k)$ and $\overline{X}_B(k)$, i.e., $\overline{X}_{MAX}(k)$. The $\overline{X}_{MAX}(k)$ signal is supplied to log unit 703 which generates its logarithm, namely, LOG[$\overline{X}_{MAX}(k)$]. The LOG[$\overline{X}_{MAX}(k)$] value is used as an address to access a look-up table to generate normalized update gain value K, in this example, in accordance with the characteristic shown in FIG. 5. The look-up table is stored, for example, in a read only memory (ROM).

Although the embodiments of the present invention have been described in simplified block diagram form, preferred embodiments are realized by appropriately programming a digital signal processor to obtain the equalizer, gain unit, power estimator, adaptation constant calculator and echo canceler functions. One such digital signal processor (DSP) unit is manufactured by AT&T Technologies, Inc. and is described in several articles in *The Bell System Technical Journal,* Vol. 60, No. 7, Part 2, dated September 1981. A prior known repeater employing a digital signal processor is broadly described in an article entitled, "Digital Signal Solves Hybrid Balance Puzzle", *Telephone Engineer & Management,* Aug. 1, 1983, pages 39–46.

Figure 8:
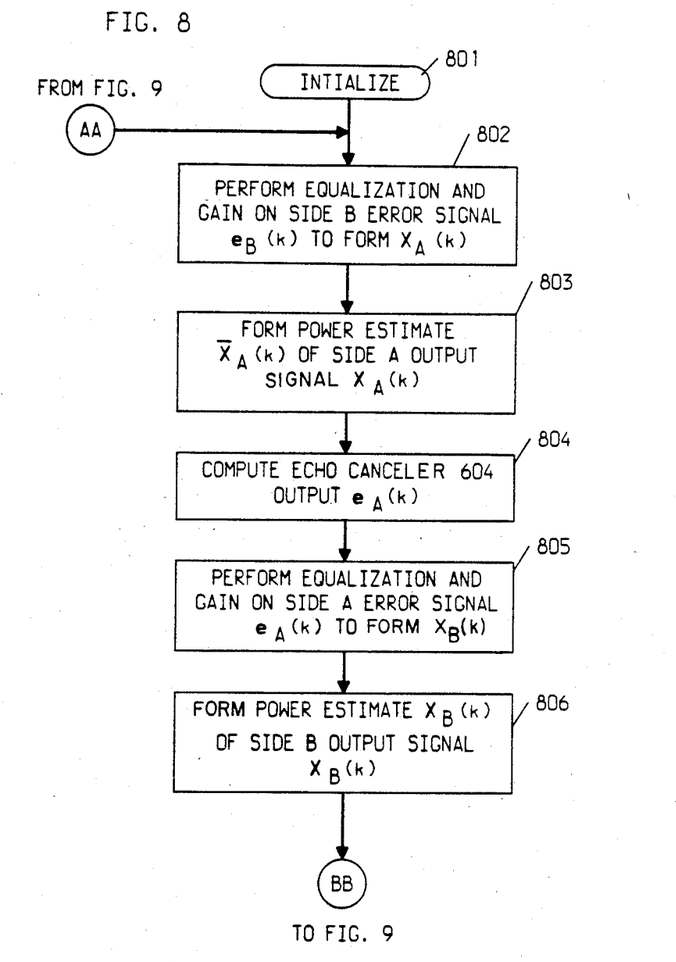
FIGS. 8 and 9 when connected AA—AA and BB—BB form a flow chart useful in describing operation of the bidirectional transmission network of FIG. 6 including aspects of the invention.
Figure 9:
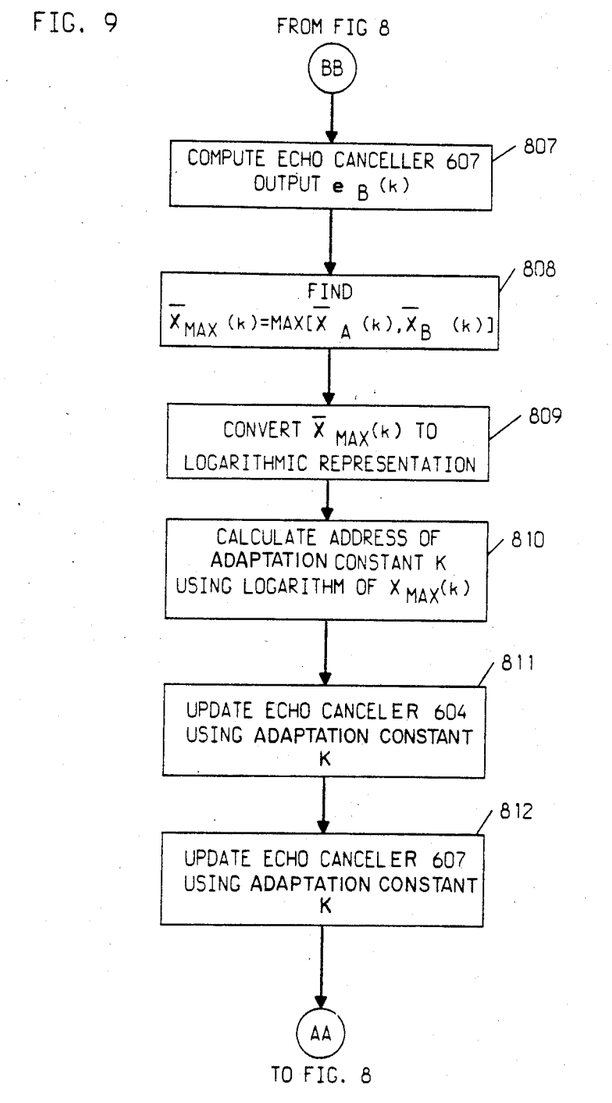

Accordingly, the equalizer, gain unit, power estimator, adaptation constant calculator and echo canceler functions of the bidirectional repeater of FIG. 6 are realized by programming a DSP unit. Operation of the repeater, in accordance with aspects of the invention, is described in conjunction with the digital program flow chart of FIGS. 8 and 9. FIGS. 8 and 9 when connected AA—AA and BB—BB form a flow chart of a program routine for realizing the above-noted repeater functions. Thus, the DSP is initialized in well-known fashion via 801. Operational block 802 performs the equalization and gain functions on error signal $e_B(k)$ from echo canceler 607 to form the A side signal $X_A(k)$. Then, the operational block 803 forms the power estimate $\overline{X}_A(k)$ of $X_A(k)$. Operational block 804 caused the generation of echo canceler 604 error signal $e_A(k)$. This is achieved by employing a known echo canceler algorithm, for example, the one disclosed in the article entitled "A Single-Chip VLSI Echo Canceler" cited above. Operational block 805 causes the equalization and gain functions to be performed on the side A error signal $e_A(k)$ to form side B output signal $X_B(k)$. Then, operational block 806 causes power estimate $\overline{X}_B(k)$ to be formed of side B output signal $X_B(k)$. Operational block 807 causes echo canceler 607 error signal output $e_B(k)$ to be computed. This computation is realized in the same fashion as for $e_A(b)$ in operational block 804. Operational block 810 causes $\overline{X}_{MAX}(k) = $ MAX of $\overline{X}_A(k), \overline{X}_B(b)$ to be found. Then, operational block 809 converts $\overline{X}_{MAX}(k)$ to logarithmic form. Operational block 810 generates an address for the adaptation constant, i.e., normalized gain value K using LOG($X_{MAX}(k)$). Operational block 811 causes echo canceler 604 to be updated using adaptation constant K. Similarly, operational block 812 causes echo canceler 607 to be updated also using adaptation constant K.

What is claimed is:

1. In an adaptive transversal filter of the type including:

means for generating a plurality of amplitude coefficient signals, said plurality of amplitude coefficient signals forming an impulse response, said means for generating said amplitude coefficient signals including controllable gain means responsive to a gain control signal for adjusting gain used in updating each of said plurality of amplitude coefficient signals;

means for generating said gain control signal including, means for generating a power estimate of a signal incoming to said adaptive filter, and means supplied with said power estimate for generating a normalized gain value as a first function of said power estimate and for controllably increasing said gain value for power estimate values which are greater than a predetermined threshold value, wherein said gain value is increased to be larger than that which would have been generated in accordance with said first function of said power estimate for said power estimate values which are greater than said predetermined threshold value, said normalized gain value being said gain control signal.

2. The invention as defined in claim 1 wherein said power estimate generating means comprises a low pass filter.

3. The invention as defined in claim 2 wherein said normalized gain value generating means includes means for storing predetermined normalized gain values corresponding to values of said power estimate and means responsive to said power estimate value for addressing said storing means to output a corresponding normalized gain value.

4. The invention as defined in claim 3 wherein said transversal filter is employed in an echo canceler.

5. In an adaptive transversal filter of the type including:

means for generating a plurality of amplitude coefficient signals, said plurality of amplitude coefficient signals forming an impulse response, said means for generating said amplitude coefficient signals including controllable gain means responsive to a gain control signal for adjusting gain used in updating each of said plurality of amplitude coefficient signals;

means for generating said gain control signal including, means for generating a power estimate of a signal incoming to said adaptive filter, and means supplied with said power estimate for generating a normalized gain value and for limiting said normalized gain value to a predetermined value for power estimate values which are greater than a predetermined threshold value, said normalized gain value being said gain control signal.

6. The invention as defined in claim 5 wherein said normalized gain value is limited to a fixed value for power estimate values which are greater than said threshold value.

7. The invention as defined in claim 6 wherein said power estimate generating means comprises a low pass filter.

8. The invention as defined in claim 6 wherein said normalized gain value generating and limiting means includes means for storing predetermined normalized gain values and means responsive to said power estimate value for addressing said storing means to output a corresponding normalized gain value.

9. The invention as defined in claim 8 wherein said transversal filter is employed in an echo canceler.

10. In a bidirectional repeater of the type including a first echo canceler adapted for canceling echo signals resulting in a first direction of transmission and a second echo canceler adapted for canceling echo signals resulting in a second direction of transmission, each of said echo cancelers including an adaptive transversal filter having a plurality of means each for generating a corresponding one of a plurality of amplitude coefficient signal, each of said amplitude coefficient signal generating means including controllable gain means responsive to a gain control signal for adjusting gain used in updating said corresponding amplitude coefficient signal;

means for generating a single gain control signal which is supplied to both said first and second echo cancelers including,     first means for generating a first power estimate of a signal incoming to said first echo canceler,     second means for generating a second power estimate of a signal incoming to said second echo canceler, and     means supplied with said first and second power estimate values for generating a single normalized gain value and for limiting said normalized gain value to a predetermined value for power estimate values which are greater than a predetermined threshold value, said normalized gain value being said gain control signal.

11. The invention as defined in claim 10 wherein said means for generating said normalized gain value includes means for selecting either said first power estimate or said second power estimate in accordance with a prescribed criterion for generating said normalized gain value.

12. The invention as defined in claim 11 wherein said prescribed selecting criterion is to select the greater of the first and second power estimates.

13. The invention as defined in claim 12 wherein said normalized gain value is limited to a fixed value for selected power estimate values greater than said predetermined threshold value.

14. The invention as defined in claim 13 wherein said normalized gain value generating and limiting means further includes means for storing predetermined normalized gain values corresponding to predetermined power estimate values and means responsive to said selected power estimate values for addressing said storing means to output a corresponding normalized gain value.

15. The invention as defined in claim 14 wherein each of said first and second power estimate generating means comprises a low pass filter.

16. In a bidirectional repeater of the type including a first echo canceler adapted for canceling echo signals resulting in a first direction of transmission and a second echo canceler adapted for canceling echo signals resulting in a second direction of transmission, each of said echo cancelers including an adaptive transversal filter having a plurality of means each for generating a corresponding one of a plurality of amplitude coefficient signals, each of said amplitude coefficient signal generating means including controllable gain means responsive to a gain control signal for adjusting gain used in updating said corresponding amplitude coefficient signal;

means for generating a single gain control signal which is supplied to both said first and second echo cancelers including,     first means for generating a first power estimate of a signal incoming to said first echo canceler,     second means for generating a second power estimate of a signal incoming to said second echo canceler, and     means supplied with said first and second power estimate values for generating a single normalized gain value as a first function of said power estimates and for increasing said normalized gain value for power estimate values which are greater than a predetermined threshold value, wherein said gain value is increased to be a value larger than that which would have been generated in accordance with said first function of said power estimates for said power estimate values which are greater than said predetermined threshold value, said normalized gain value being said gain control signal.

17. The invention as defined in claim 16 wherein said means for generating and increasing said normalized gain value includes means for selecting the greater value of said first and second power estimate values for generating said single normalized gain value.

* * * * *

UNITED STATES PATENT AND TRADEMARK OFFICE
CERTIFICATE OF CORRECTION

PATENT NO.  : 4,591,669
DATED       : May 27, 1986
INVENTOR(S) : Donald L. Duttweiler; John Hartung It is certified that error appears in the above—identified patent and that said Letters Patent is hereby corrected as shown below:

Column 5, line 7 of the table under K ".03155" should read --.03125--.

Column 7, line 32, "caused" should read --causes--.

Column 3, line 51, "acho" should read --echo--.

Signed and Sealed this

Fourteenth Day of October, 1986

[SEAL]

Attest:

DONALD J. QUIGG

Attesting Officer

Commissioner of Patents and Trademarks